(12) United States Patent
Frank

(10) Patent No.: US 7,277,403 B2
(45) Date of Patent: Oct. 2, 2007

(54) DUPLEXER WITH A DIFFERENTIAL RECEIVER PORT IMPLEMENTED USING ACOUSTIC RESONATOR ELEMENTS

(75) Inventor: Michael Louis Frank, Los Gatos, CA (US)

(73) Assignee: Avago Technologies Wireless IP (Singapore) Pte Ltd, Singapore (SG)

( * ) Notice: Subject to any disclaimer, the term of this patent is extended or adjusted under 35 U.S.C. 154(b) by 1038 days.

(21) Appl. No.: 10/017,207

(22) Filed: Dec. 13, 2001

(65) Prior Publication Data
US 2003/0112768 A1 Jun. 19, 2003

(51) Int. Cl.
*H04B 3/20* (2006.01)
*H04B 1/44* (2006.01)
*H04L 12/56* (2006.01)

(52) U.S. Cl. ............ 370/282; 370/290; 370/419; 370/463

(58) Field of Classification Search ........... 370/293, 370/279, 276, 282, 419, 430, 463
See application file for complete search history.

(56) References Cited

U.S. PATENT DOCUMENTS

| | | | |
|---|---|---|---|
| 4,460,877 A | | 7/1984 | Sterns |
| 5,369,413 A | * | 11/1994 | Hannan ............ 343/770 |
| 5,818,385 A | * | 10/1998 | Bartholomew ........... 342/372 |
| 6,081,171 A | * | 6/2000 | Ella .................. 333/189 |
| 6,104,745 A | * | 8/2000 | Koh ................. 375/130 |
| 2001/0017578 A1 | * | 8/2001 | Kadota et al. ............ 333/193 |
| 2001/0043024 A1 | | 11/2001 | Takamine et al. |
| 2001/0052830 A1 | * | 12/2001 | Noguchi et al. .......... 333/133 |
| 2003/0060170 A1 | * | 3/2003 | Tikka et al. ............. 455/73 |
| 2003/0098631 A1 | * | 5/2003 | Ruby et al. ............. 310/312 |

FOREIGN PATENT DOCUMENTS

DE 3341719 11/1993

OTHER PUBLICATIONS

Katuhiko Gunzi, Tomokazu Komazaki, Norio Onishi (Vehicular Technology Conference, 1988 IEEE 38th, Jun. 15-17, 1988 pp. 560-565) discloses A New Type Duplexer.*

* cited by examiner

*Primary Examiner*—Chi Pham
*Assistant Examiner*—Melanie Jagannathan

(57) ABSTRACT

A duplexer includes an input/output line, a receive segment and a transmit segment. The transmit segment is connected to the input/output line. The receive segment includes a balun and a differential filter. The balun includes a first output, a second output, a first transmission line and a second transmission line. The first transmission line is connected between the input/output line and the first output. The second transmission line is connected between the input/output line and the second output. The differential filter is connected to the first output and the second output. The differential filter shorts the first output and the second output at transmit band frequencies of the duplexer.

22 Claims, 6 Drawing Sheets

DUPLEXER WITH A DIFFERENTIAL RECEIVER PORT IMPLEMENTED USING ACOUSTIC RESONATOR ELEMENTS

BACKGROUND

The present invention concerns circuits used for communication systems and pertains specifically to a duplexer with a differential receiver port implemented using acoustic resonator elements.

For applications such as cellular phones, it is desirable to reduce the size of components. Particularly, it is desirable to integrate RF duplexers and filters as part of a radio-on-a-chip with a readily manufactured technology.

Acoustic resonator elements have been used to implement filters. One advantage of using acoustic resonator elements is that the speed of sound is approximately three or four orders of magnitude smaller than the speed of light, making the wavelengths, and thus the dimensions of a device, small compared with conventional (L-C) tank circuits.

Currently available duplexers using acoustic resonators such as surface acoustic wave (SAW) elements or film bulk acoustic resonator (FBAR) are fully single ended. Such duplexers generally require that the receive (Rx) filter present a short circuit at the transmit (Tx) band frequency. This short circuit is transformed into an open circuit through the utilization of a quarter wave transmission line. The short circuit, in practice, is more capacitive than desired, and the quarter wave transmission line can be modified to account for this imperfection. The end result is still an open circuit at the transmit band frequency. This prevents the receive filter from loading the transmit path. Similarly, the transmit filter presents an open circuit at the receive band frequency, directly. This is accomplished by starting with a series resonator.

SUMMARY OF THE INVENTION

In accordance with the preferred embodiment of the present invention, a duplexer is presented. The duplexer includes an input/output line, a receive segment and a transmit segment. The transmit segment is connected to the input/output line. The receive segment includes a balun and a differential filter. The balun includes a first output, a second output, a first transmission line and a second transmission line. The first transmission line is connected between the input/output line and the first output. The second transmission line is connected between the input/output line and the second output. The differential filter is connected to the first output and the second output. The differential filter shorts the first output and the second output at transmit band frequencies of the duplexer.

DESCRIPTION OF THE PREFERRED EMBODIMENT

Figure 1:
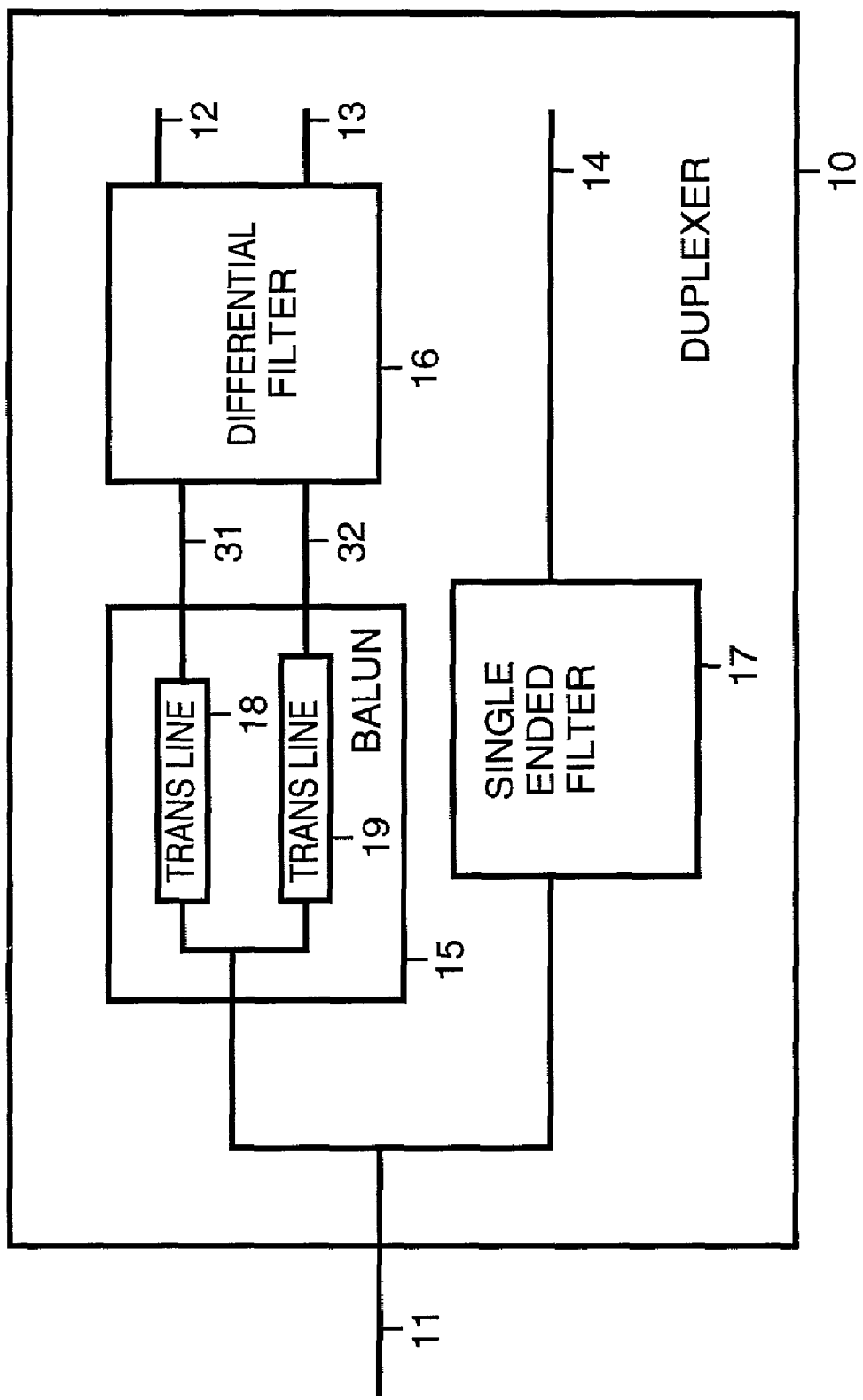
FIG. 1 is a simplified block diagram of a duplexer that includes a single-ended filter on the transmit side and a balun with a differential filter on the receiver side in accordance with a preferred embodiment of the present invention.

FIG. 1 is a simplified block diagram of a duplexer 10. Duplexer 10 includes a single-ended filter 17 on the transmit side. Duplexer 10 includes a balun 15 and a differential filter 16 on the receiver side.

Data to be transmitted is placed on input 14 of single-ended filter 17. Transmitted data leaves duplexer 10 on an input/output 11. Single-ended filter 17 has two response regimes, the pass-band and the reject band(s). In the pass-band, single-ended filter 17 has the characteristic impedance (symbolized by Zo) of duplexer 10, the system in which single-ended filter 17 is embedded. This is typically 10 Ω to 300 Ω for high frequency (greater than one gigahertz (GHz)) radio assemblies. In the reject band, single-ended filter 17 is much different impedance than the characteristic impedance. Thus, the pass-band frequencies are allowed to continue, the reject band frequencies are halted.

In the preferred embodiment, single-ended filter 17 presents an open circuit at the receive band frequency and has a passband centered at the transmit band frequency. In a typical application in which duplexer 10 is used, the receive band frequency varies by only about four percent from the transmit band frequency. Thus, for example, when the receive band frequency is 1.930 GHz to 1.990 GHz, the transmit frequency is 1.850 GHz to 1.9910 GHz, respectively.

Balun 15 includes a transmission line 18 and a transmission line 19. For example, transmission line 18 has a length that provides approximately a one quarter wavelength ($\lambda/4$) phase shift for the receive band frequencies. Transmission line 19 has a length that provides approximately a three quarter wavelength ($3\lambda/4$) phase shift for the receive band frequencies. This balun provides a differential signal between an input 31 and an input 32 of differential filter 16. Input 31 of differential filter 16 is at a first output of balun 15. Input 32 of differential filter 16 is at a second output of balun 15.

Differential filter 16 is a bandpass filter with a bandpass frequency centered around the receive band frequency. At the receive band frequency, a passband is created between inputs 31 and 32 of differential filter 16 and an output 12 and an output 13 of differential filter 16. At the transmit band frequency, differential filter 16 is a short circuit between input 31 and input 32 or, depending upon the implementation, provides a short circuit from input 31 to a reference voltage and from input 32 to the reference voltage.

At the transmit band frequency, the short circuit provided by differential filter 16 is transformed into an open circuit through the utilization of transmission line 18 and transmission line 19.

As is known by persons skilled in the art, transmission lines can be used to transform from one impedance to another. A shorted shunt transmission line of a given length, can transform the impedance between the characteristic impedance (Zo) and a short circuit, varying smoothly with frequency. The short circuit provided by differential filter 16 for the transmit frequency, in practice, is more capacitive than desired, and the transmission line can be modified to account for this imperfection. The end result is still an open circuit at the transmit band frequency. This prevents the differential filter 16 from loading the transmit path.

Figure 2:
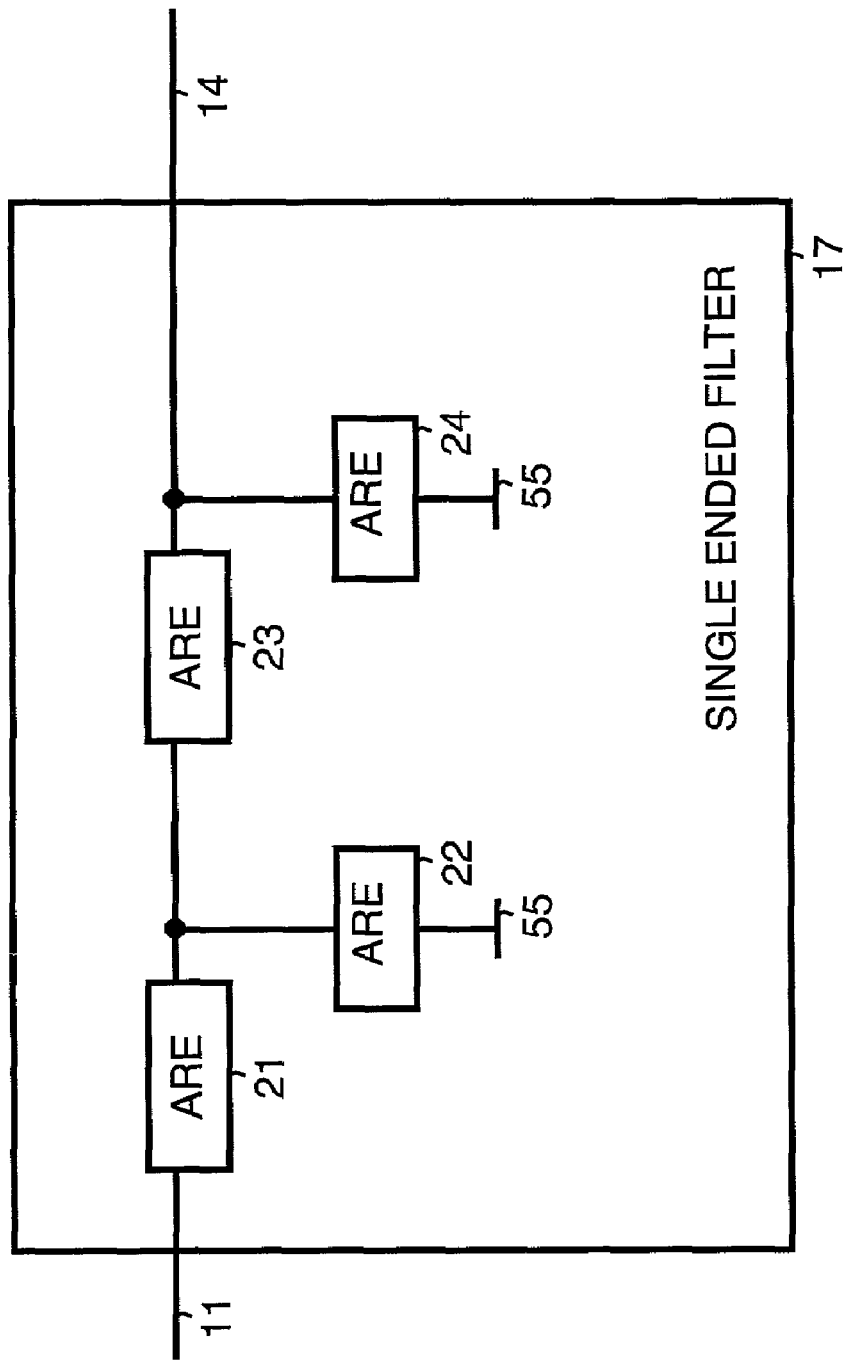
FIG. 2 is a simplified block diagram of an example single-ended filter on the transmit side of the duplexer shown in FIG. 1 in accordance with a preferred embodiment of the present invention.

FIG. 2 is a simplified block diagram of an example implementation of single-ended filter 17. Singled ended filter 17 is shown to include an acoustic resonator element (ARE) 21, an acoustic resonator element 22, an acoustic resonator element 23, and an acoustic resonator element 24. For example, each acoustic resonator element is a film bulk acoustic resonator (FBAR). Alternatively, each acoustic resonator element can be another type of acoustic resonator element such as a surface acoustic wave (SAW) element. The example implementation of single-ended filter 17 is a half ladder structure with two half ladder segments. The first segment includes ARE 21 and ARE 22. ARE 22 is connected to a reference voltage 55. The second segment includes ARE 23 and ARE 24. ARE 24 is connected to reference voltage 55. Single-ended filter 17 could be implemented differently. For example, single-ended filter 17 could include more or fewer half ladder segments.

Figure 3:
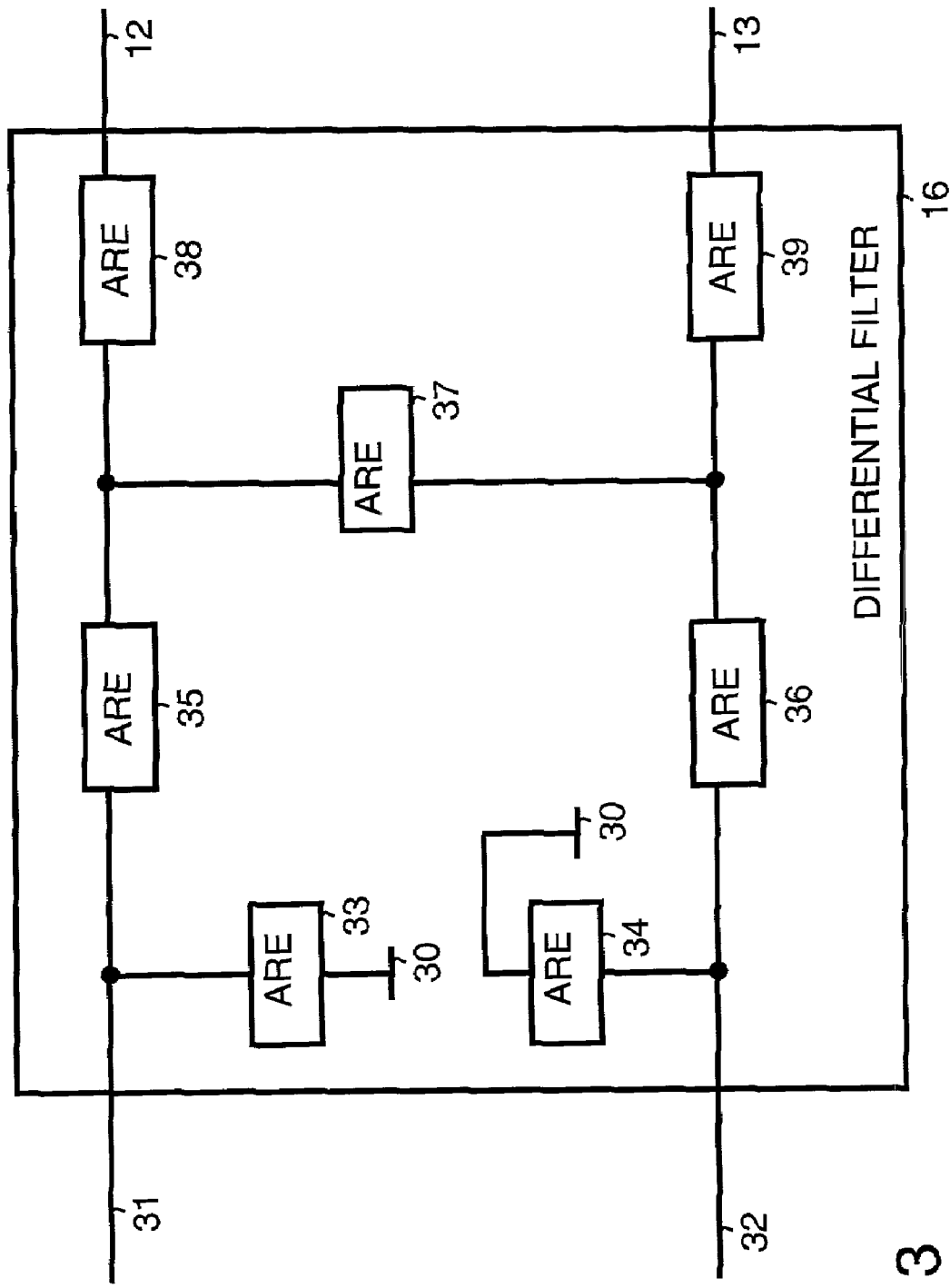
FIG. 3 is a simplified block diagram of an example differential filter on the receive side of the duplexer shown in FIG. 1 in accordance with a preferred embodiment of the present invention.

FIG. 3 is a simplified block diagram of an example implementation of differential filter 16. Differential filter 16 is shown to include an acoustic resonator element (ARE) 33, an acoustic resonator element 34, an acoustic resonator element 35, an acoustic resonator element 36, an acoustic resonator element 37, an acoustic resonator element 38 and an acoustic resonator element 39. For example, each acoustic resonator element is a film bulk acoustic resonator (FBAR). Alternatively, each acoustic resonator element can be another type of acoustic resonator element such as a surface acoustic wave (SAW) element.

The implementation of differential filter 16 shown in FIG. 3 includes a paired half ladder segment that includes ARE 33, ARE 35, ARE 34 and ARE 36. ARE 33 and ARE 34 are both connected to a reference voltage 30 as shown. A paired half ladder structure is a structure in which at least one acoustic resonator element is connected between a first input and a first output of the structure, at least one acoustic resonator element is connected between a second input and a second output of the structure, at least one acoustic resonator is connected in a shunt connection between a reference voltage and one end of an acoustic resonator connected between the first input and the first output of the paired half ladder structure, and at least one acoustic resonator is connected in a shunt connection between the reference voltage and one end of an acoustic resonator connected between the second input and the second output of the paired half ladder structure.

The implementation of differential filter 16 shown in FIG. 3 also includes a full ladder segment that includes ARE 37, ARE 38 and ARE 39. A full ladder structure is a structure in which at least one acoustic resonator element is connected between a first input and a first output of the structure, at least one acoustic resonator element is connected between a second input and a second output of the structure, and at least one acoustic resonator is connected in a shunt connection between one end of an acoustic resonator connected between the first input and the first output of the full ladder structure and one end of an acoustic resonator connected between the second input and the second output of the full ladder structure.

Values for the resonator elements are chosen so that the passband includes the receive band frequencies. At the transmit band frequencies, the shunt elements, ARE 33 and ARE 34, provide a short circuit to a reference voltage. As indicated before, balun 15 (shown in FIG. 1) will transform this rather capacitive short circuit into an open circuit at the transmit band frequencies. This implementation of differential filter 16 could be modified, for example, to include more or fewer paired half ladder segments or full ladder segments.

Figure 4:
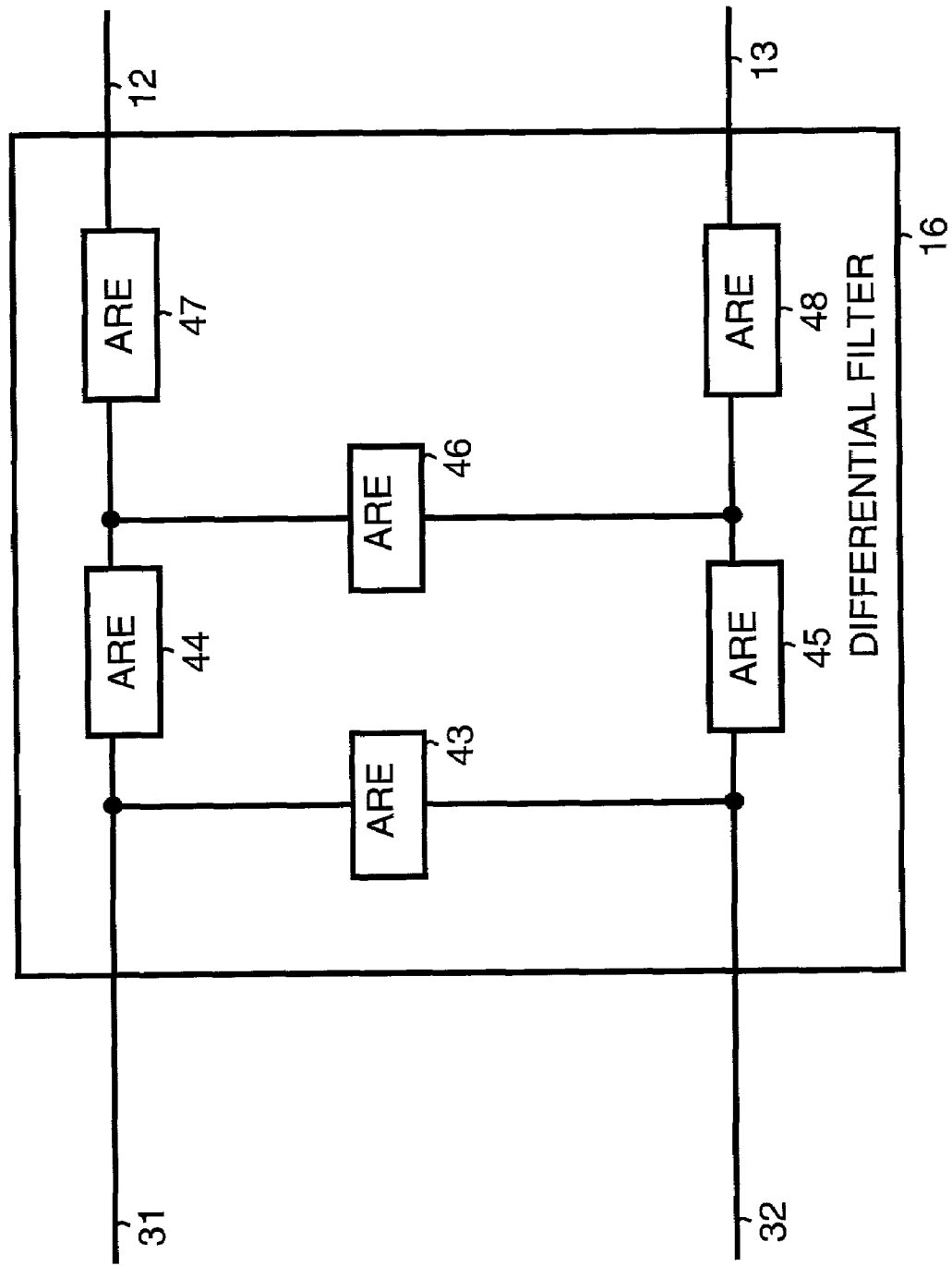
FIG. 4 is a simplified block diagram of another example differential filter on the receive side of the duplexer shown in FIG. 1 in accordance with a preferred embodiment of the present invention.

FIG. 4 is a simplified block diagram of another possible implementation of differential filter 16. Differential filter 16 is shown to include an acoustic resonator element (ARE) 43, an acoustic resonator element 44, an acoustic resonator element 45, an acoustic resonator element 46, an acoustic resonator element 47 and an acoustic resonator element 48. For example, each acoustic resonator element is a film bulk acoustic resonator (FBAR). Alternatively, each acoustic resonator element can be another type of acoustic resonator element such as a surface acoustic wave (SAW) element.

The implementation of differential filter 16 shown in FIG. 4 includes a full ladder segment that includes ARE 43, ARE 45 and ARE 44. The implementation of differential filter 16 shown in FIG. 4 also includes a full ladder segment that includes ARE 46, ARE 47 and ARE 48. Values for the resonator elements are chosen so that the passband includes the receive band frequencies. At the transmit band frequencies, the shunt element ARE 43 provides a short circuit between input 31 and input 32. As indicated before, balun 15 (shown in FIG. 1) will transform this rather capacitive short circuit into an open circuit at the transmit band frequencies. This implementation of differential filter 16 can be modified, for example, to include more or fewer full ladder segments.

Figure 5:
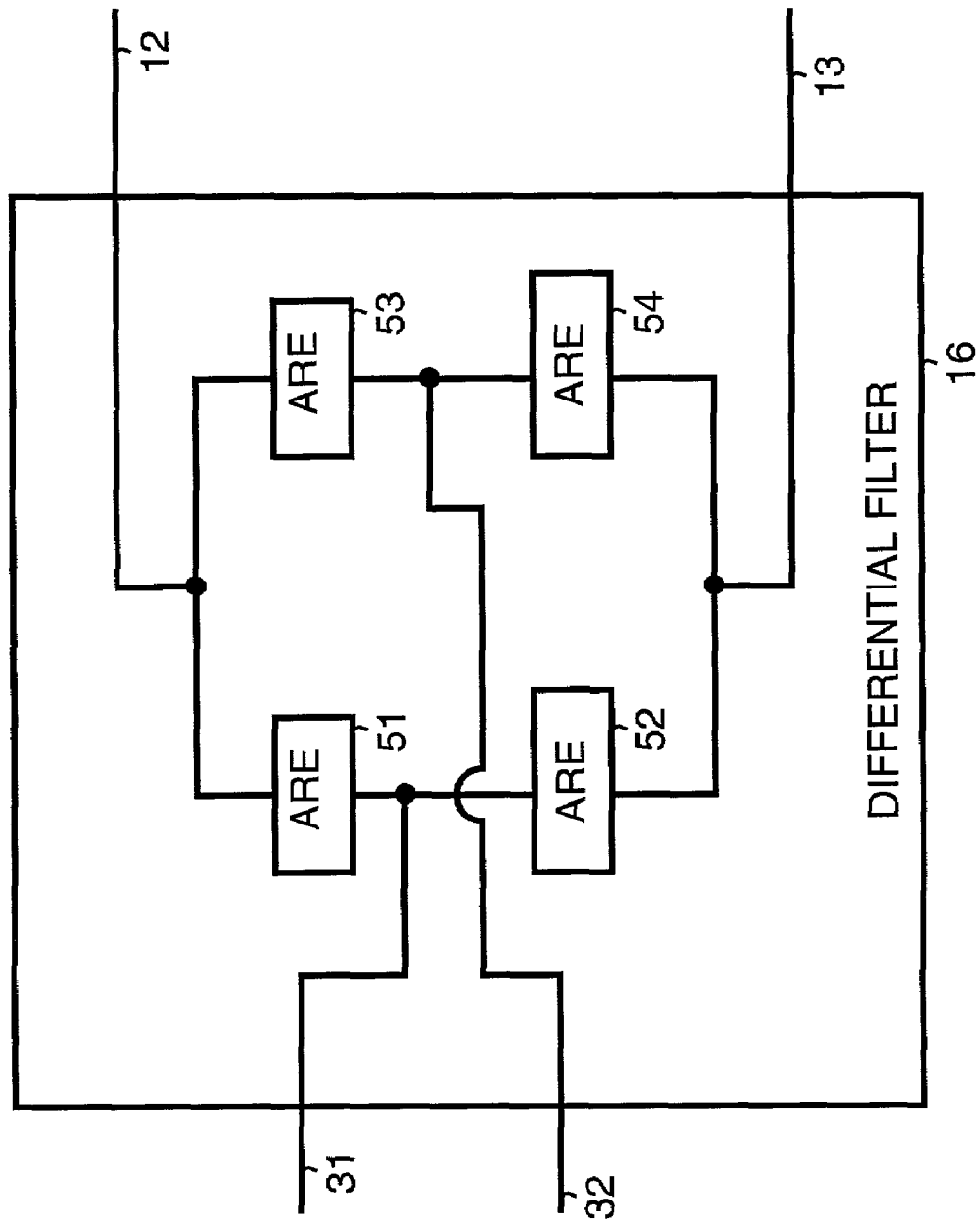
FIG. 5 is a simplified block diagram of another example differential filter on the receive side of the duplexer shown in FIG. 1 in accordance with a preferred embodiment of the present invention.

FIG. 5 is a simplified block diagram of another possible implementation of differential filter 16. Differential filter 16 is shown to include an acoustic resonator element (ARE) 51, an acoustic resonator element 52, an acoustic resonator element 53 and an acoustic resonator element 54. For example, each acoustic resonator element is a film bulk acoustic resonator (FBAR). Alternatively, each acoustic resonator element can be another type of acoustic resonator element such as a surface acoustic wave (SAW) element.

The implementation of differential filter 16 shown in FIG. 5 includes a single lattice segment. A lattice structure is a structure in which at least one acoustic resonator element is connected in a series connection between every input and every output of the lattice structure. Values for the resonator elements are chosen so that there is a capacitive short circuit between input 31 and input 32 at the transmit band frequencies. Because this lattice implementation of differential filter 16 can only be a short in the reject band, this lattice implementation can only be used as the input of only one of a pair of frequency offset filters. As indicated before, balun 15 (shown in FIG. 1) will transform this rather capacitive short circuit into an open circuit at the transmit band frequencies. This implementation of differential filter 16 can be modified, for example, to include more lattice segments. Additionally, this implementation of differential filter 16 could be modified, for example, to include one or more paired half ladder segments and/or one or more full ladder segments.

In alternative embodiments, differential filter 16 can be implemented differently provided differential filter 16 provides a short circuit at the transmit band frequencies of duplexer 10. In alternative embodiments, balun 15 can be implemented other ways, for example, through the use of lumped equivalents.

Figure 6:
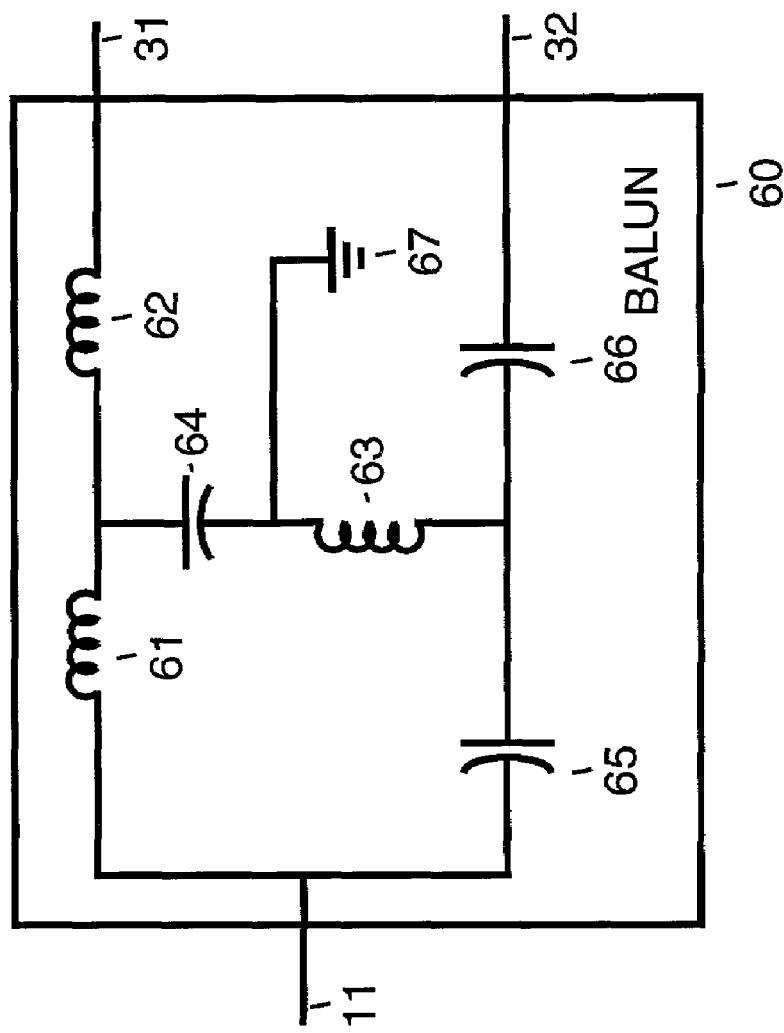
FIG. 6 is a simplified block diagram of an alternative embodiment of a balun.

FIG. 6 shows an example of balun 15 being replaced by a balun 60 that uses lumped equivalents. When replacing balun 15, balun 60 is connected to input/output 11, balun output 31 and balun output 32. Balun 60 includes an inductor 61, an inductor 62, an inductor 63, a capacitor 64 a capacitor 65 and a capacitor 66 connected to input/output 11, balun output 31, balun output 32 and a reference signal 67 as shown.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A duplexer comprising:
   an input/output line;
   a transmit segment connected to the input/output line; and,
   a receive segment, the receive segment including:
      a balun including:
         a first output,
         a second output,
         a first transmission line coupled between the input/output line and the first output, and
         a second transmission line coupled between the input/output line and the second output, and
      a differential filter connected to the first output and the second output, the differential filter including resonator elements connected so that at transmit band frequencies of the duplexer, the first output and the second output are shorted.

2. A duplexer as in claim 1 wherein at transmit band frequencies of the duplexer, the first output and the second output are each shorted to a reference voltage.

3. A duplexer as in claim 1 wherein at transmit band frequencies of the duplexer, the first output and the second output are shorted to each other.

4. A duplexer as in claim 1 wherein the resonator elements are arranged so that the differential filter includes resonator elements arranged in a paired half ladder structure.

5. A duplexer as in claim 1 wherein the resonator elements are arranged so that the differential filter includes resonator elements arranged in a full ladder structure.

6. A duplexer as in claim 1 wherein the resonator elements are arranged so that the differential filter includes resonator elements arranged in a lattice structure.

7. A duplexer as in claim 1 wherein the resonator elements are arranged so that the differential filter includes resonator elements arranged in both a paired half ladder structure and a full ladder structure.

8. A duplexer as in claim 1 wherein a length of the first transmission line is chosen to cause a phase delay of approximately one fourth wave length at receive band frequencies of the duplexer, and a length of the second transmission line is chosen to cause a phase delay of approximately three fourths wave length at the receive band frequencies of the duplexer.

9. A duplexer as in claim 1 wherein the transmit segment includes a single ended filter including resonator elements connected so that at receive band frequencies of the duplexer, an open circuit is presented by the single ended filter to the input/output line.

10. A duplexer as in claim 1 wherein the resonator elements are each implemented as a film bulk acoustic resonator (FBAR).

11. A method for providing filtering within a duplexer, the method comprising the following steps:

(a) for signals at the transmit band frequencies, performing the following sub steps:
      (a.1) providing passband transmission through a single-ended filter of the duplexer, and
      (a.2) providing a short circuit at a first input and second input of a differential filter, the first input of the differential filter being connected to an input/output line of the duplexer via a balun and the second input of the differential filter being connected to the input/output line of the duplexer via the balun; and,
   (b) for signals at the receive band frequencies, performing the following sub step:
      (b.1) providing passband transmission through the differential filter of the duplexer.

12. A method as in claim 11 wherein substep (a.2) includes at transmit band frequencies of the duplexer, shorting the first output and the second output to a reference voltage.

13. A method as in claim 11 wherein substep (a.2) includes at transmit band frequencies of the duplexer, shorting the first output and the second output to each other.

14. A method as in claim 11 wherein step (b) additionally includes the following substeps performed for signals at the receive band frequencies:
   (b.2) providing a phase delay of approximately one fourth wave length through a first transmission line within the balun, and
   (b.3) providing a phase delay of approximately three fourths wave length through a second transmission line within the balun.

15. A method as in claim 11 wherein step (b) additionally includes the following substep performed for signals at the receive band frequencies:
   (b.2) providing an open circuit by the single-ended filter to the input/output line.

16. A duplexer comprising:
   an input/output line;
   a transmit segment; connected to the input/output line; and,
   a receive segment, the receive segment including:
      a balun connected to the input/output line, the balun including:
         a first output, and
         a second output, and
      a differential filter connected to the first output and the second output, the differential filter shorting the first output and the second output at transmit band frequencies of the duplexer.

17. A duplexer as in claim 16 wherein at transmit band frequencies of the duplexer, the first output and the second output are each shorted to a reference voltage.

18. A duplexer as in claim 16 wherein at transmit band frequencies of the duplexer, the first output and the second output are shorted to each other.

19. A duplexer as in claim 16 wherein the transmit segment includes a single-ended filter wherein at receive band frequencies of the duplexer, an open circuit is presented by the single-ended filter to the input/output line.

20. A duplexer as in claim 16 wherein the balun additionally includes:
   a first transmission line coupled between the input/output line and first output; and,
   a second transmission line coupled between the input/output line and the second output.

21. A duplexer as in claim 16 wherein the balun additionally includes:

a first transmission line coupled between the input/output line and the first output, a length of the first transmission line is chosen to cause a phase delay of approximately one fourth wave length at receive band frequencies of the duplexer; and, a second transmission line coupled between the input/output line and the second output, a length of the second transmission line is chosen to cause a phase delay of approximately three fourths wave length at the receive band frequencies of the duplexer.

22. A duplexer as in claim 16 wherein the differential filter includes resonator elements connected so that at transmit band frequencies of the duplexer, the first output and the second output are shorted.

* * * * *